United States Patent [19]

Iwata et al.

[11] Patent Number: 4,611,553
[45] Date of Patent: Sep. 16, 1986

[54] SUCTION NOZZLE

[75] Inventors: Isamu Iwata; Hirotaro Hosoe; Yuji Matsuoka, all of Shizuoka, Japan

[73] Assignee: Fuji Photo Film Co., Ltd., Kanagawa, Japan

[21] Appl. No.: 649,800

[22] Filed: Sep. 12, 1984

[30] Foreign Application Priority Data

Sep. 12, 1983 [JP] Japan .......................... 58-141123[U]

[51] Int. Cl.4 ...................... B05C 11/02; B05C 11/06
[52] U.S. Cl. ........................................ 118/50; 118/63; 15/302
[58] Field of Search .................. 118/50, 63; 15/302

[56] References Cited

U.S. PATENT DOCUMENTS 2,899,339 8/1959 Rakus ............................... 118/63 X
3,849,830 11/1974 Wagner ................................. 15/302

Primary Examiner—John P. McIntosh
Attorney, Agent, or Firm—Sughrue, Mion, Zinn, Macpeak & Seas

[57] ABSTRACT

An improved suction nozzle for removing raised edge portions of coated layer formed on flexible substrates such as photographic film, pre-sensitized plate, or magnetic tape. The suction nozzle has a dual pipe structure with a cleaning liquid jetting outlet and a cleaning liquid sucking inlet at one end thereof. The jetting outlet is offset from a longitudinal axis of the nozzle and forms an angle of 30° to 85° with respect to that longitudinal axis. The sucking inlet is located along the longitudinal axis.

5 Claims, 4 Drawing Figures

SUCTION NOZZLE

BACKGROUND OF THE INVENTION

The present invention relates to a nozzle used in a process for applying a coating composition to an elongated, flexible support (web) which is continuously moving. Such a process may be used in the manufacture of a photosensitive material such as photographic film or paper, pre-sensitized plate, a magnetic recording material such as magnetic recording tape, or a recording material such as pressure-sensitive recording paper or heat-sensitive recording paper.

More particularly, the invention relates to a device for treating the lateral edge parts of a coated layer formed on the web.

In a coating process of this type, the coated layer often has a tendency to rise along both lateral edges of the web to form the edge bead portions due to the surface tension of the coating composition In such a case, the coated layer is not uniformly dried in the following drying process. Accordingly, the edge bead portions should be removed before the drying zone.

U.S. Pat. No. 2,899,339 discloses a method for removing the edge bead portions and a device for practicing the method. In accordance with the method, hollow nozzles for sucking up coating compostion are provided along both lateral edges of a web. Each nozzle has an L-shaped pipe structure. A spray or jet stream of diluent or solvent is supplied from the peripheral part of the nozzle, and coating composition together with diluent or solvent is removed into the central part thereof. The present invention is intended to provide an improved suction nozzle for the same process.

The inventors have practiced the coating process disclosed by the aforementioned patent and found that much of the spray of diluent or solvent supplied from the peripheral part of the nozzle is sucked up before reaching the opening of the nozzle, as a result of which the edge bead portions of the coated layer formed along the edges of the web are not sufficiently removed.

Further, Japanese Laid-Open Patent Application No. 73579/1981 has proposed a coating process in which a liquid is jetted from the central part of a suction nozzle having a dual pipe structure for application to the raised parts of a coated layer, and the liquid and the coating composition of the edge bead portions are sucked into the suction nozzle. However, this method also suffers from difficulties in that the liquid jetted from the central part of the nozzle may flow over to the rear side of the web which should not be coated, or it may foul rollers located near the nozzle.

Accordingly, an object of the present invention is to provide a suction nozzle for removing the lateral edge bead portions of a coated layer in which the above-described difficulties accompanying a conventional suction nozzle have been eliminated, and which operates effectively and causes no contamination.

SUMMARY OF THE INVENTION

The foregoing and other objects of the invention have been achieved by the provision of a suction nozzle having a dual pipe structure with a cleaning liquid jetting outlet and a cleaning liquid sucking inlet at its end, in which, according to the invention, the jetting nozzle is offset from the longitudinal axis of the nozzle and forms an angle of 30° to 85° with respect to the longitudinal axis of the nozzle, and the sucking inlet is positioned on the longitudinal axis.

DESCRIPTION OF THE PREFERRED EMBODIMENTS

The invention will now be described in more detail with reference to the accompanying drawings.

Figure 1:
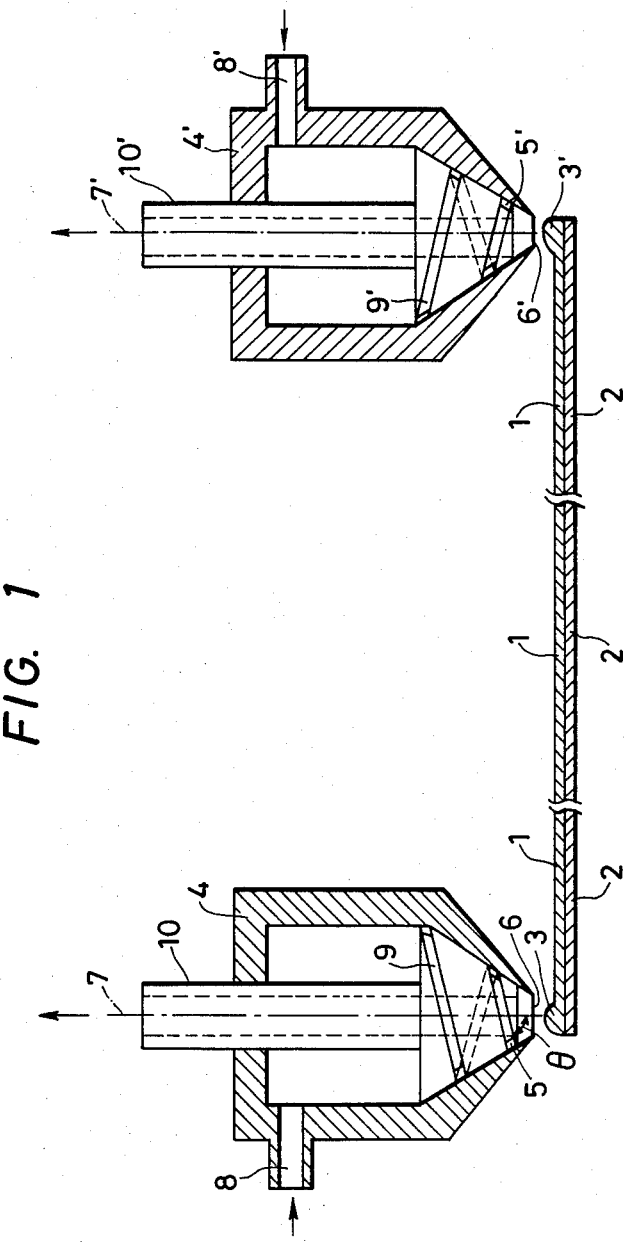
FIG. 1 is a sectional diagram, with parts cut away, schematically showing an example of a suction nozzle according to the invention.
Figure 2:
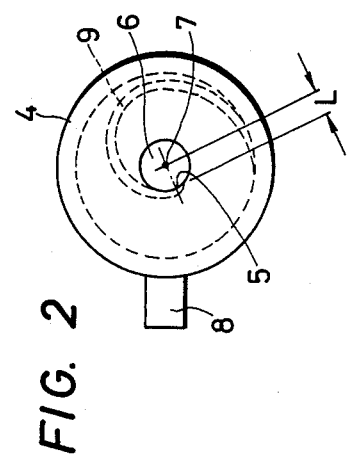
FIG. 2 is a front view of the suction nozzle of FIG. 1.

In FIGS. 1 and 2, a web 2 with a coated layer 1 moves in a direction perpendicular to the surface of the drawing. The lateral edge bead portions 3 and 3' of the coated layer are removed by suction nozzle 4 and 4'. The suction nozzle 4 (4') is of a dual pipe structure having a cleaning liquid jetting outlet 5 (5') and a cleaning liquid sucking inlet 6 (6') at the end. The jetting outlet 5 (5') is offset from the longitudinal axis 7 (7') of the nozzle, and the sucking inlet 6 (6' is located on this axis. In FIGS. 1 and 2, reference numerals 8 and 8' designate cleaning solution supply ports to which water or solvent is supplied. The cleaning liquids are supplied from the cleaning liquid supply ports 8 and 8' through spiral connecting grooves 9 and 9' to the jetting outlets 5 and 5', respectively. In FIG. 1, reference numerals 10 and 10' designate evacuating ports which are connected to a vacuum pump (not shown) and which are used to remove the lateral edge bead portions after dilution, together with the cleaning liquid from the coated layer.

Figure 3:
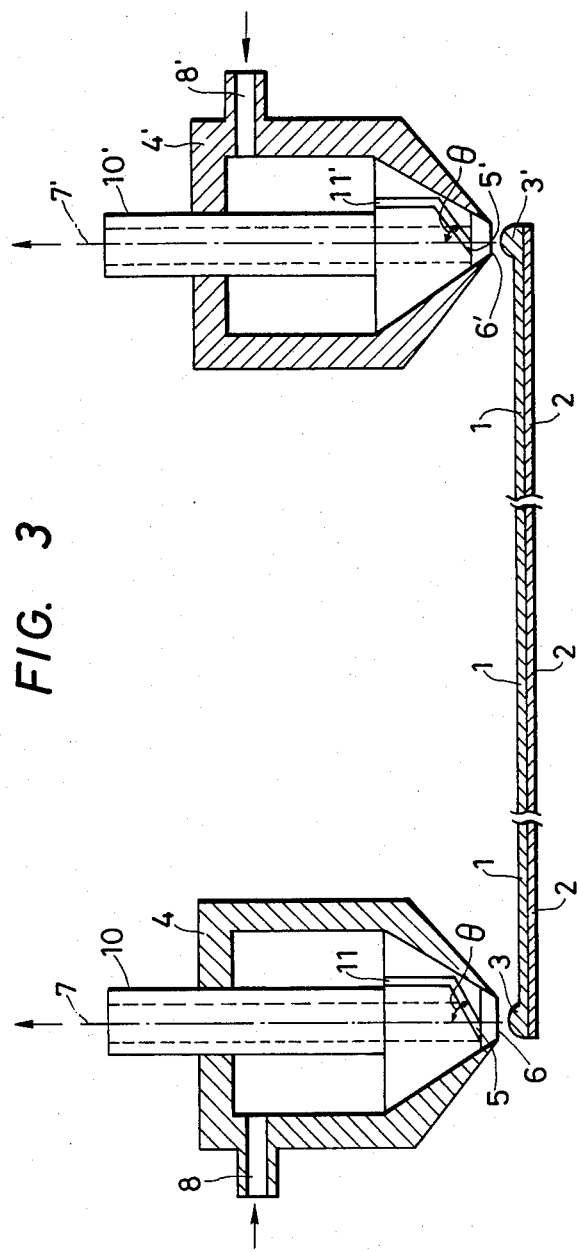
FIG. 3 is a sectional diagram, with parts cut away, schematically showing another example of a suction nozzle according to the invention.
Figure 4:
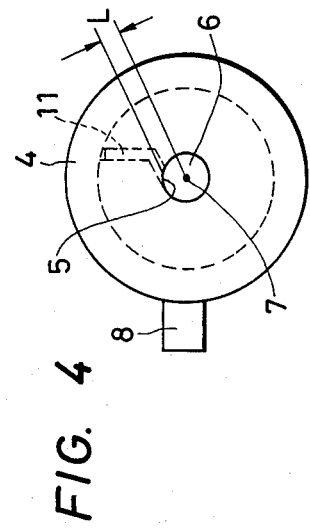
FIG. 4 is a front view of the suction nozzle shown in FIG. 3.

Another example of a suction nozzle according to the invention is shown in FIGS. 3 and 4. This embodiment has the same construction as the first example shown in FIGS. 1 and 2 except that connecting grooves 11 and 11' are straight.

It is essential that the suction nozzle be so designed that the cleaning liquid jetted from the jetting outlet 5 (5') form an eddy stream at the end of the nozzle. The eddy stream thus formed effectively and positively cleans the sucking inlet 6 (6') without fouling other components. In order to form the eddy stream of cleaning liquid, it is effective to offset the cleaning liquid jetting outlet 5 (5') from the longitudinal axis 7 (7') of the nozzle. In FIG. 2 or 4, it is preferable that the distance L between the jetting outlet 5 and the axis 7 be at least 2 mm. If the distance L is smaller than 2 mm, it is difficult to form the eddy stream. In addition, it is essential that the angle between the jetting outlet and the longitudinal axis of the nozzle, that is, the angle $\theta$ ($\theta'$) indicated in FIGS. 1 and 3 be in the range of 30 to 85 degrees. If the angle is smaller than 30 degrees, then the liquid may flow to the rear side of the web or the rollers and foul these areas. If the angle is larger than 90 degrees, the sucking inlet 6 (6') will not be sufficiently cleaned.

If the suction nozzles of the invention are positioned 0.5 to 2.0 mm from the coated layer (in a direction perpendicular to the latter), the edge bead portions of the coated layer formed along both edges of the web will be effectively removed.

According to the invention, no dead zone is provided in the suction nozzle. Therefore, the coating composition will not solidify or accumulate inside the nozzle; that is, the nozzle is maintained clean at all times. Thus, the nozzle can operate stably for long periods. As a result, in the manufacture, for instance, of a recording material which includes coating and drying steps, the use of the suction nozzle can decrease the drying load and increase the productivity.

While preferred embodiments of the invention have been described in detail, it is particularly understood that the invention is not limited thereto or thereby and that various changes and modifications may be made thereto without departing from the scope of the invention. For instance, a plurality of connecting grooves may be formed in combination with a plurality of jetting outlets, the pipe may be tapered by changing the inside diameter, or the nozzle end may be made sharp. These techniques may be employed separately or in combination.

We claim:

1. In a suction nozzle having a dual pipe structure with a cleaning liquid jetting outlet and a cleaning liquid sucking inlet at an end thereof, the improvement therein:

said jetting outlet is offset from a longitudinal axis of said nozzle and forms an angle in a range of 30° to 85° with respect to a line parallel to said axis and intersecting said outlet; and said sucking inlet is located on said axis.

2. The suction nozzle of claim 1, wherein said jetting outlet is connected with a cleaning liquid supply port through a spiral connecting groove.

3. The suction nozzle of claim 1, wherein said jetting outlet is connected with a cleaning liquid supply port through a substantially straight groove.

4. The suction nozzle of claim 1, wherein a distance between said jetting outlet and said longitudinal axis is at lest 2 mm.

5. The suction nozzle of claim 1, wherein said sucking inlet is positioned 0.5 to 2.0 mm from a coated layer in a direction perpendicular to said coated layer for removing lateral edge bead portions from said coated layer.

* * * * *